June 19, 1956 C. C. BOPP 2,751,446

AUTOMATIC GAIN CONTROL CIRCUIT FOR TRANSISTOR AMPLIFIERS

Filed Oct. 15, 1953

INVENTOR
CALVIN C. BOPP

BY Alden D. Redfield

ATTORNEY 2,751,446
Patented June 19, 1956

2,751,446

AUTOMATIC GAIN CONTROL CIRCUIT FOR TRANSISTOR AMPLIFIERS

Calvin C. Bopp, Cincinnati, Ohio, assignor to Avco Manufacturing Corporation, Cincinnati, Ohio, a corporation of Delaware Application October 15, 1953, Serial No. 386,254
10 Claims. (Cl. 179—171.9)

Figures 1, 2:
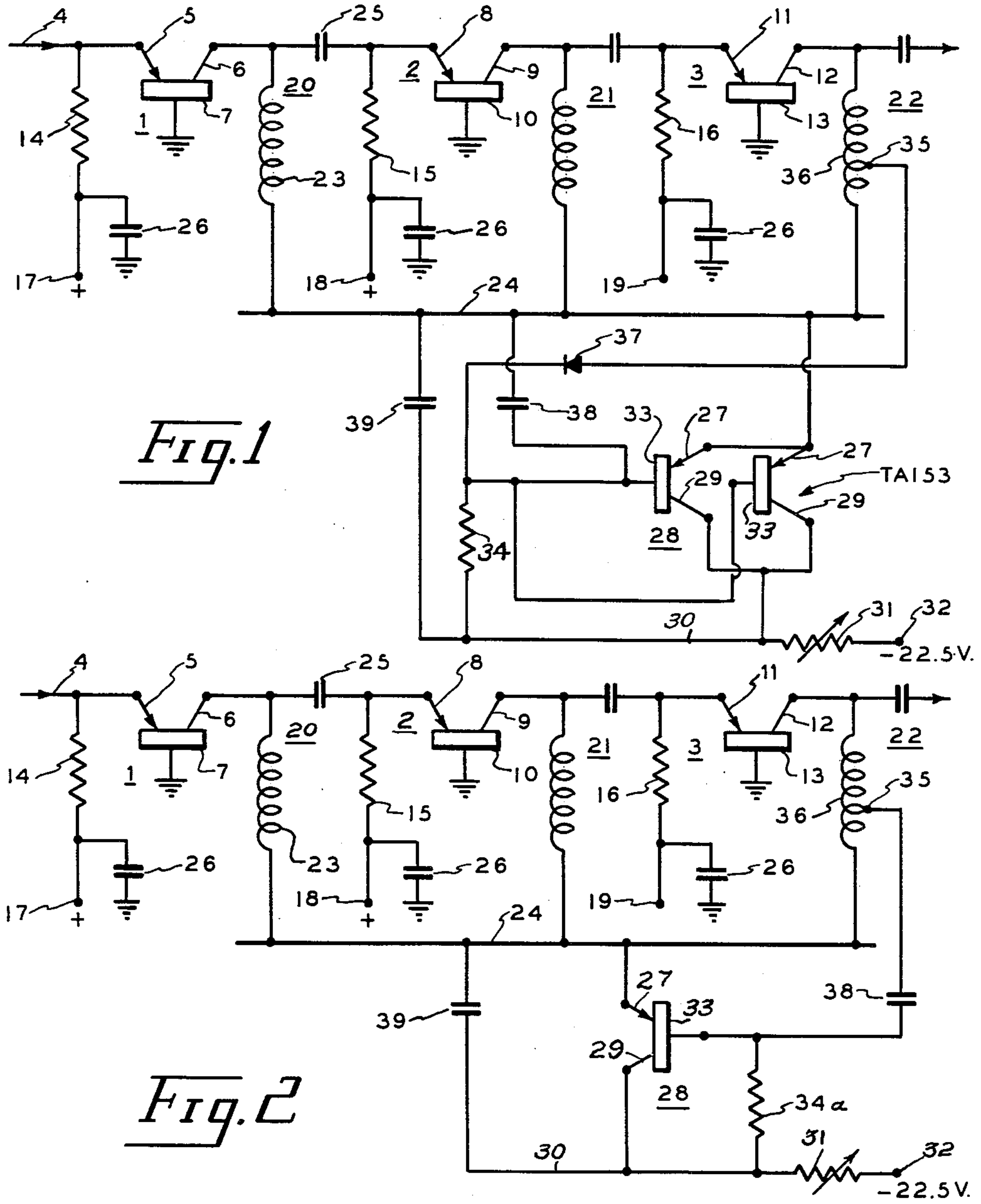

The present invention relates generally to transistor amplifiers, and more particularly to transistor amplifiers incorporating provision for controlling the gain of the amplifiers.

It is a broad object of my invention to provide a novel automatic gain control (AGC) circuit for transistor amplifiers.

It is a further object of my invention to provide a novel gain control circuit for tuned transistor amplifier stages in which variation of gain does not materially affect the center frequency or the selectivity of the tuned circuits of the amplifier.

It is still another object of my invention to provide a gain control system for transistor amplifiers having the feature that the gain of the amplifiers may be varied without a concomitant material variation in transistor input or output impedance.

Still another object of my invention resides in the provision of a gain control system for a transistor amplifier, employing a transistor as a voltage responsive impedance connected between a source of collector voltage and the collector of the gain controlled amplifier.

It is still another object of my invention to provide a voltage responsive device for controlling the flow of current to a transistor electrode, the device including the collector to emitter circuit of a control transistor connected in series with the flow of current, the base electrode of the control transistor being employed as a control element for the control transistor.

The above and still further features, objects and advantages of my invention will become apparent upon consideration of the following detailed disclosure of a specific embodiment thereof, especially when taken in conjunction with the accompanying drawings, wherein:

Figure 1 is a schematic circuit diagram of a transistor amplifier having a plurality of cascaded tuned stages, and provided with an automatic gain control circuit; and Figure 2 is a schematic circuit diagram of a modification of the arrangement illustrated in Figure 1.

Briefly describing the invention and the background of the art involved, it is known that electrical signals may be amplified in a circuit having as its active element a transsistor. Transistors exist in various and diverse forms, but normally include a body consisting of a block of semi-conducting material, and a plurality of electrodes connected to the block in a specified manner. The body of the transistor may be a block of crystalline germanium, the crystalline structure of which has been altered by introducing slight quantities of impurities. The character of the impurities introduced determines the conductive type of the transistor. Two common types are, for example, P-type and N-type. When the major portion of the block comprises material of one type, for example N-type, the transistor is referred to as N-type, and vice versa. Formed point contacts, which are respectively denominated the emitter contact and the collector contact, are arranged to make contact with the surface of the germanium block. A third electrode, denominated the base electrode, is arranged to make low resistance contact with the body of the block.

It is known that if N-type germanium is used for the block material, small P-type areas exist beneath the point contacts, which provide rectifying barriers. The transistor then possesses amplifying properties.

It have assumed in the following detailed description of may invention, use of an N-type transistor in a main amplifier, i. e. use of N-type semi-conducting material having P-type barrier layers and use of point contact emitter and collector. It will be apparent that transistors of the P-type, i. e. comprising a semi-conductive block of P-type material with a barrier layer of N-type material, may be employed in the practice of my invention, provided the polarities of the biases as supplied to the various electrodes of the transistor be suitably selected. I do not desire, therefore, to be limited to any specific transistor type. Junction type transistors are also well known, and may be employed in the practice of my invention, and in particular are employed in one specific embodiment of my invention, as a variable impedance or gain control amplifier.

In the case of an N-type transistor, it is well known that the emitter electrode should be biased with respect to the base electrode so that a small positive current, of the order of magnitude of .3 milliampere, flows from the emitter through the semi-conducting block, i. e. in a forward direction. In order to accomplish this result the emitter electrode is normally operated at a positive D. C. bias potential with respect to the base electrode, of the order of several millivolts. This value is not, however, critical, and sufficient variation exists among different transistor units that some of these may be operated with a smaller or larger emitter voltage than than specified. Transistor circuits of the N-type are normally operated with a relatively high negative bias, of perhaps 10–30 volts, applied to the collector electrode, although these values are not critical and be departed from in considerable degree.

It has been found that the gain of a transistor amplifier may be varied, when holding emitter bias constant, by varying collector bias, or, when holding collector bias constant, by varying emitter bias. Experimental curves of gain vs. emitter bias and gain vs. collector bias show that, if emitter current is held constant the gain is roughly proportional to collector current and, of course, collector dissipation. Conversely, if the collector current is held constant, gain is inversely proportional to emitter current over a limited range. For certain transistor amplifiers tested experimentally, current gain (alpha) was found to be relatively constant for emitter currents above 0.3 ma. and to increase rather rapidly as the emitter current approached zero.

An investigation of the effects of emitter and collector bias on input impedance of certain transistors reveals that this impedance varies rapidly with emitter bias current below 0.3 ma. for the specific transistor type tested, and also that A. C. output impedance begins to decrease for certain values of collector current. These facts appear to indicate that emitter bias variation is not a satisfactory way of accomplishing gain control in a multistage tuned amplifier, because of the effect impedance variation may have on selectivity and tuning. Experiment indicates, in fact, that variation in emitter bias in such amplifiers is accompanied by unacceptable variations of bandwidth and center frequency, at least unless the emitter bias is varied about some current value which does not provide near optimum gain for the system.

Experimental evidence obtained by measuring gain vs. collector bias of the same transistors indicates, on the other hand, that for collector currents above 3.0 ma., change in tuning and bandwidth is quite small, in tuned circuits driving and driven by the transistor.

It therefore appears, for transistors of the type tested, that gain control in tuned amplifier stages may be accomplished by varying collector bias about a suitable value, without adversely affecting bandwidth or center frequency, but that gain control cannot be accomplished satisfactorily by variation of emitter bias, or by variation of collector bias outside a relatively critical set of values, i. e. from about 2.0 to 4.0 ma. Analogous results may be obtained with other transistor types.

A further factor of importance in the operation of transistor amplifiers relates to the effects of temperature. The gain of some transistor types is found to fall off inversely with temperature, with a reduction of approximately 6 db at 125° F. although alpha actually increases with temperature. Since the gain of a grounded base transistor amplifier, to provide a specific example, is approximately alpha squared times collector resistance, it appears that collector resistance decreases with temperature more rapidly than alpha squared increase, for the operating point considered. In general, it may be asserted that at high temperatures there is a loss in gain and an increase of collector dissipation.

For the type WE 1768 transistor, biased at $Ie$=.4 ma. and $Ic$=3.2 ma., D. C. collector resistance is found to vary almost linearly from approximately 5,000 ohms to 500 ohms over the temperature range from room ambient to +180° F. This effect implies a change in tuning and selectivity of tuned amplifiers incorporating the transistors, with variation of temperature, and is therefore an undesirable phenomenon. It has been found possible to hold collector power relatively constant by inserting a suitable resistance in the collector supply circuit, the required resistance for a single transistor being approximately equal to the square root of the product of collector resistances at the limits of temperature considered. Utilizing this value of compensation, the power was found to rise only 20% at the mid-temperature (130° F.). A more suitable value of resistance may therefore be slightly higher than that specified.

It has been found, as hereinbefore explained, that gain control of a transistor I. F. amplifier may be most effectively accomplished by varying collector voltage over a predetermined range of bias currents, and that for this range bandwith and center frequency of the amplifier are but slightly affected. Gain may be controlled over a range of approximately 30 db in this manner, with little effect on the input or output impedances of the type WE 1768 transistor. To provide more specific operating data for this transistor type, decreasing the collector voltage from —17 to —6 volts results in 20 db uniform decrease in gain. Similar results may be accomplished utilizing other transistor types.

Outstanding difficulties encountered in effecting gain control by varying collector bias arise because of the amount of current which must be handled, i. e. about 10 ma. for a three-stage amplifier, as well as because of the radical variation of collector voltage involved, when considered on a percentage basis.

I have accordingly devised a new and improved AGC circuit for transistor amplifiers, which employs junction transistors of adequate current rating, as D. C. gain control amplifiers. If no single transistor is capable of handling the required current, two or more in parallel may be employed. The control transistors may be operated with emitter grounded, and with collector to emitter circuit in series between a negative source of voltage and the collector electrodes of a plurality of cascaded gain controlled I. F. amplifier stages. A fixed resistance may be connected from the base of the control transistor to the negative voltage source, and signals may be derived from the last I. F. stage of the controlled stages and fed to the base of the control transistor via a rectifier. A control voltage is thus developed across the fixed resistance, which controls impedance between collector electrode and emitter electrode of the control transistor, and thereby the voltage at the collector electrodes of the gain controlled amplifier. In a modification of the invention, the control transistor may itself provide the required rectification.

The voltage drop across the AGC amplifier should be kept low, since this drop is in series with the supply circuit of the I. F. amplifier. The initial voltage across the AGC amplifier is determined by the value of base resistance employed, and may be set within the range of 2 to 8 volts. A range of I. F. input signals between 1,000 and 100,000 mv. was tested, and found to result in a variation of 110 ma. delivered by the rectifier. This variation produced an 11 volt change at the collector electrodes of the I. F. amplifier. Assuming an initial collector electrode voltage of 17 volts, this eleven volt reduction decreased the gain of the I. F. amplifier approximately 20 db. While a greater range may be obtained by making the initial collector voltage lower, this reduces the gain, and there is a concomitant undesirable decrease in stability.

Referring now more particularly to the accompanying drawings, the reference numerals 1, 2, 3 denote, respectively, cascaded amplifier stages, utilizing point contact transistors as amplifying elements. The reference numeral 4 denotes an input lead to the emitter electrode 5 of transistor 1, the latter possessing also a collector electrode 6 and a base 7. Similarly, the transistor 2 possesses an emitter electrode 8, a collector electrode 9 and a base 10, and the transistor 3 possesses an emitter electrode 11, a collector electrode 12 and a base 13.

The emitter electrodes 5, 8, 11 of the transistors 1, 2, 3, respectively, are suitably biased positively via resistances 14, 15, 16, respectively, from positive voltage terminals 17, 18, 19. These terminals may be commonly supplied from a single voltage source, in practice.

The interstage coupling circuits employ impedance matching networks, matching the output or collector impedance of each stage of the amplifier to the input or emitter electrode circuit of the succeeding stage, or the output load of the amplifier, at the frequency of operation of the amplifier.

Identifying the coupling networks, respectively, by the reference numerals 20, 21, 22, and bearing in mind that the several coupling networks are preferably identical, wherefore a description of one will suffice for all, the coupling network 20 consists of an inductance 23 in series between a lead 24 and a collector electrode 6, and a capacitor 25 in series between collector electrode 6 of stage 1 and emitter electrode 8 of stage 2.

The values of inductance and capacitance of circuit elements 23 and 25 are such that they form a parallel resonant circuit, as seen from the collector electrode 6, the capacitive branch of which includes the impedance of emitter 8, in series. The collector electrode 6 thus sees a high impedance at the frequency of operation. The emitter electrode 8, on the other hand, is in a series resonant circuit, including capacitor 25 and inductance 23, and therefore sees a low impedance. By proper selection of circuit Q, the impedances of collector 6 and emitter 8 may be matched at the frequency of operation, thus effecting maximum power transfer between stages of the amplifier, while providing necessary D. C. isolation. Similar coupling networks are employed between each pair of stages.

The coupling network, as applied in transistor amplifiers, hereinabove described by reference to the accompanying drawings, has been more fully disclosed and explained, and its advantages pointed out, in my application for U. S. Patent, Serial No. 385,799, filed October 13, 1953.

Completing the description of my novel intermediate frequency amplifier, it will be noted that the base electrodes 7, 10, 13 are connected directly to ground, and that by-pass condensers 26 are provided, connected from positive voltage terminals 17, 18, 19, respectively, to ground.

The voltage supplied to the collector electrodes 6, 9 and 12 is that obtaining at lead 24. The lead 24 is connected to a pair of emitter contacts 27, of P–N–P type junction transistors 28, connected in parallel. The transistors 28 may be of type TA 153, recited for example only, and are operated in parallel to provide sufficient capacity to supply the collector current drain of the three amplifier stages 1, 2, 3. The collector electrodes 29 are connected in parallel to a lead 30, which is in turn connected via a temperature compensating resistance 31 to a negative voltage terminal 32, supplied with voltage from a source (not shown), a suitable value for which is —22.5 v. The resistance 31 may be variable, if desired, and have a maximum value above that required to compensate for variations of collector resistance with temperature, of collector electrodes 6, 9, 12, so that adjustment to a suitable value may be readily accomplished.

In the case of a simple single stage amplifier having no AGC circuits, the value of the resistance 31 may be slightly above the geometric mean of the collector resistances at the extremes of the temperature range considered, as explained hereinabove. In the more complex system of Figure 1, the internal impedance of transistors 28 must be considered, and this impedance varies with temperature. Also, the fact must be taken into consideration that resistance 31 and transistors 28 are in series with a plurality of collector electrodes 6, 9, 12, all in parallel. Selection of a suitable vaue for resistance 31 is therefore best accomplished empirically for optimum operation, in the light of the principles above enunciated, and to this end resistance 31 is made variable. Clearly, resistance 31 may be omitted, or reduced to zero, if desired, without affecting the operation of the system other than in respect to temperature compensation, and in respect to values of operating collector voltages available for a given supply voltage. Obviously, the connection of resistance 31 in circuit implies a voltage drop therein, which may, if desired, be compensated for by increasing the voltage of the supply.

Connected between bases 33 of control transistors 28 and collector electrodes 29, is a resistance 34. A tap 35 is taken from a suitable point along inductance 36 of the impedance matching circuit 22, and connected via rectifier 37 to bases 33.

One condenser 38 (.01 mf.) is connected from bases 33 to lead 24, and another similar condenser 39 from collector electrodes 29 to lead 24.

In operation, the voltage at signal frequency which appears between tap 35 and lead 24, proportional to the output of the amplifier at signal frequency, is rectified by rectifier 37 and develops a D. C. voltage across resistance 34. The latter may have a value of 7000 ohms, in one specific embodiment of my invention, although I do not desire to be limited to any specific values. The initial value of voltage across resistance 34 may be set within the range of 2 to 8 volts. For one specific design of my novel amplifier, it was then found that the variation in the current delivered by the amplifier to the base, for a range of input signals between 1,000 and 100,000 mv., was 110 ma. This variation, applied to the AGC amplifier comprising transistors 28, produced an 11 volt change in collector voltage at the main amplifier, and a decrease of gain of approximately 20 db.

The AGC amplifier acts essentially as a variable resistance in the collector supply lead of the main amplifier, thus controlling the collector voltage and current. The value of the resistance inserted is controlled by the base to emitter voltage of the AGC transistors 28, or, in other words, by the base current of the AGC transistors 28. The initial voltage drop across the AGC transistors 28 is made small by selection of the bias applied to the base element via the resistance 34. The initial base bias provided by resistance 34 is caused to decrease by virtue of the D. C. current of opposing sign which flows through the rectifier diode 37. The decrease is proportional to the signal appearing in the collector circuit of the transistor 3. It will be noted that use of the grounded emitter connection, in the AGC amplifier, provides maximum current gain and phase inversion. Maximum current gain is required because the control signal available from transistor 3 is small, and provision of this control signal represents loading of the main amplifiers.

The system of Figure 1 utilizes a rectifier 37 to generate control signals for the AGC amplifier. In a modification of my invention illustrated in Figure 2 of the accompanying drawings, the rectifier 37 is dispensed with, and the required rectification accomplished by the AGC transistor 28, thus effecting a circuit simplification. In the system illustrated in Figure 2 of the accompanying drawings, rectification occurs in the emitter to base circuits of the transistor, when the signal amplitude exceeds the initial bias. The establishment of any predetermined initial bias thus inherently establishes a delayed gain control system, i. e., one in which no gain control action occurs until the output of the main amplifier exceeds some predetermined value.

The same numerals of reference are employed to identify corresponding elements in the several figures of the drawings, and insofar as the structure and operation of the several systems are identical, duplication is dispensed with, in the interest of conciseness.

In the system of Figure 2, a single control transistor 28 is illustrated. It will be realized, however, that two transistors in parallel may be employed, as in the system of Figure 1, and that in a practical system, employing the transistor types specified herein, two will be required.

Referring now more particularly to Figure 2, the emitter electrode 27 of transistor 28 is connected to lead 24. The collector electrode 29 is connected to one terminal of variable resistance 31, the other terminal being connected to voltage supply terminal 32. A base bias resistance 34*a* is connected between base electrode 33 and collector electrode 29, and base electrode 33 is further coupled to tap 35 on inductance 36, via coupling condenser 38.

It will be noted that the voltage at signal frequency subsisting between tap 35 and lead 24, is impressed via condenser 38 between emitter electrode 27 and base 33. When the voltage at signal frequency exceeds the no-signal bias established across resistance 34*a*, the structure comprising emitter electrode 27 and base 33, acting as a diode rectifier, conducts. A D. C. voltage then develops across condenser 38, which modifies the bias on the base 33 of transistor 28, and thereby the internal impedance from emitter electrode 27 to collector electrode 29. This variation of impedance is reflected as a reduction of bias at collector electrodes 6, 9, 12 of the main amplifier, which is reflected as a reduction of gain.

While I have described and illustrated a specific embodiment of my invention, it will be clear that variations of circuit values, and of details of circuit arrangement, may be resorted to without departing from the true spirit and scope of the invention as defined in the appended claims.

What I claim is:

1. A gain control circuit for a main transistor amplifier, said main transistor amplifier having an emitter electrode, a collector electrode and a base electrode, said gain control circuit including a direct current transistor amplifier, said direct current transistor amplifier having an emitter electrode, a collector electrode, and a base electrode, a source of bias voltage for the collector electrode of said main transistor amplifier, means connecting said source of bias voltage in series with the collector electrode to emitter electrode circuit of said direct current transistor amplifier and with said collector electrodes of said main transistor amplifier, and means for varying the collector electrode to emitter electrode impedance of said direct current transistor amplifier.

2. The combination in accordance with claim 1 wherein said last means includes means for varying the base current of said direct current transistor amplifier.

3. A gain control system for a main transistor amplifier, said transistor amplifier having a plurality of cascaded stages coupled one to another by means of tuned circuits, and each of said stages including a transistor having a collector electrode as output electrode, a source of negative potential for biasing said collector electrodes, and a D. C. transistor amplifier having an emitter electrode connected to said collector electrodes and a collector electrode connected to said source of negative potential, said D. C. transistor amplifier having a base electrode, a resistance connected in series with said source between said base electrode and said collector electrode of said D. C. transistor amplifier, and means for varying the flow of current in said resistance in response to an amplified signal in said main transistor amplifier.

4. The combination in accordance with claim 3 wherein said last means includes a rectifier for rectifying said amplified signal.

5. The combination in accordance with claim 3 wherein said last means includes a rectifier for rectifying said amplified signal, said rectifier being the emitter to base electrode circuit of said D. C. transistor amplifier.

6. The combination in accordance with claim 3 wherein said last means includes a rectifier for rectifying said amplified signal, said rectifier being coupled between a point of said main transistor amplifier and said base electrode of said D. C. transistor amplifier.

7. An automatic gain controlled transistor amplifier, comprising a main transistor amplifier having an emitter electrode, collector electrode, and a base electrode, tuning means having a center frequency and connected in circuit with at least one of said electrodes for tuning said transistor amplifier, a gain control transistor amplifier having an emitter electrode, a collector electrode and a base electrode, means providing a D. C. path from the emitter electrode of said gain control transistor amplifier to the collector electrode of said main transistor amplifier, a source of negative bias voltage, means connecting the collector electrode of said gain control transistor amplifier to said source of negative bias voltage, a resistance, means connecting said resistance between the base electrode and collector electrode of said gain control transistor amplifier, means for deriving output signal from said transistor amplifier, means for rectifying said output signal to derive gain control signal, and means for impressing gain control signal on said resistance to vary the emitter to collector impedance of said gain control transistor amplifier and thereby the operating bias of said collector electrode of said main transistor amplifier.

8. The combination in accordance with claim 7 wherein the operating bias of said collector electrode of said main transistor amplifier is varied only over a range of values such that said center frequency remains substantially constant.

9. A D. C. transistor amplifier including a transistor having an emitter electrode, a collector electrode and a base electrode, a source of negative bias voltage for said collector electrode, a load circuit connected to said emitter electrode, a resistance connected from said base electrode to said collector electrode, and means for inserting a variable D. C. current in said resistance to vary the voltage in said load circuit by varying the collector electrode to emitter electrode resistance of said transistor.

10. A gain controlled main amplifier comprising a plurality of cascaded stages intercoupled by tuned circuits, each of said stages including a transistor having a collector output electrode and an output load, the output loads being connected in parallel to a junction point, a source of negative potential for biasing said collector electrodes, a D. C. amplifier having a control transistor with an emitter electrode connected to said junction point and a collector electrode connected to said source to provide a gain-controlling variable impedance of sufficient current-carrying capacity to carry the currents of said output loads, means comprising a resistor connected between the base electrode of the control transistor and said source to provide an initial base bias potential, and means sampling the output of the main amplifier to vary the base current of said control transistor, whereby said impedance is varied to control the gain of said main amplifier.

References Cited in the file of this patent

UNITED STATES PATENTS

| | | |
|---|---|---|
| 2,544,211 | Barton | Mar. 6, 1951 |
| 2,647,957 | Mallinckrodt | Aug. 4, 1953 |
| 2,662,122 | Ryder | Dec. 8, 1953 |

FOREIGN PATENTS

| | | |
|---|---|---|
| 684,879 | Great Britain | Dec. 24, 1952 |

OTHER REFERENCES

Proceedings of the I. R. E., November 1952, pages 1508–1511, article by Alexanderson.